(12) United States Patent
Morita et al.

(10) Patent No.: US 9,678,107 B2
(45) Date of Patent: Jun. 13, 2017

(54) SUBSTRATE INSPECTION APPARATUS

(71) Applicant: TOKYO ELECTRON LIMITED, Tokyo (JP)

(72) Inventors: Shingo Morita, Nirasaki (JP); Michio Murata, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 10 days.

(21) Appl. No.: 14/666,424

(22) Filed: Mar. 24, 2015

(65) Prior Publication Data
US 2015/0276810 A1    Oct. 1, 2015

(30) Foreign Application Priority Data
Mar. 27, 2014    (JP) .................. 2014-066463

(51) Int. Cl.
*G01R 1/067*    (2006.01)
*G01R 31/28*    (2006.01)
*G01R 31/27*    (2006.01)

(52) U.S. Cl.
CPC ......... *G01R 1/06794* (2013.01); *G01R 31/27* (2013.01); *G01R 31/2831* (2013.01); *G01R 31/2889* (2013.01)

(58) Field of Classification Search
CPC  G01R 1/06794; G01R 31/27; G01R 31/2831; G01R 31/2889
See application file for complete search history.

(56) References Cited

U.S. PATENT DOCUMENTS

| 2005/0068054 A1* | 3/2005 | Mok ................ G01R 3/00 324/755.05 |
| 2007/0063721 A1 | 3/2007 | Dozier, II et al. |
| 2007/0090851 A1 | 4/2007 | Kim et al. |
| 2008/0054917 A1* | 3/2008 | Henson ............. G01R 31/2889 324/754.03 |
| 2008/0290882 A1* | 11/2008 | Rogers ................... G01R 1/36 324/755.11 |

FOREIGN PATENT DOCUMENTS

JP    7-297242 A    11/1995

* cited by examiner

*Primary Examiner* — Patrick Assouad
*Assistant Examiner* — Haidong Zhang
(74) *Attorney, Agent, or Firm* — Nath, Goldberg & Meyer; Jerald L. Meyer

(57) ABSTRACT

There is provided a substrate inspection apparatus in which a contact between a probe and a semiconductor device is checked without using an IC tester. Further, when an abnormal state is detected in the contact check, a cause of the abnormal state can be determined. A prober includes a probe card having a plurality of probes to be contacted with respective electrode pads of the semiconductor device formed on a wafer W. The probe card includes a card-side inspection circuit configured to reproduce a circuit configuration of DRAM in which the semiconductor device cut from the wafer W is to be mounted, and a comparator configured to measure a potential of a line between the probe and the card-side inspection circuit.

8 Claims, 4 Drawing Sheets

SUBSTRATE INSPECTION APPARATUS

CROSS-REFERENCE TO RELATED APPLICATION

This application claims the benefit of Japanese Patent Application No. 2014-066463, filed on Mar. 27, 2014, in the Japan Patent Office, the disclosure of which is incorporated herein in its entirety by reference.

TECHNICAL FIELD

The present disclosure relates to a substrate inspection apparatus for inspecting semiconductor devices formed on a substrate without cutting the semiconductor devices from the substrate.

BACKGROUND

A prober is known as a substrate inspection apparatus that inspects electrical properties of semiconductor devices, e.g., power devices or memories, formed on a semiconductor wafer (hereinafter, simply referred to as a "wafer") as a substrate.

The prober includes a probe card having a plurality of needle-shaped probes, and a stage having a wafer loaded thereon and freely moving in upward, downward, left and right directions. Each probe of the probe card is brought into contact with an electrode pad or solder bump included in the semiconductor device. Then, an inspection current is applied to the electrode pad or solder bump from each probe, thereby inspecting the electrical properties of the semiconductor device.

The prober in the related art is connected to an IC tester that inspects electrical properties or functional faults of the semiconductor device. The circuit configuration of the IC tester is different from the circuit configuration in which a commercialized semiconductor device is mounted, e.g., the circuit configuration of a motherboard or functional expansion card. Thus, the IC tester cannot perform the inspection of the semiconductor device in its mounted state. As a result, there is a problem in that a problem of the semiconductor device, which is not detected by the IC tester, is found when the semiconductor device is mounted on the functional expansion card, or the like. In particular, recently, the processing performed by the motherboard or functional expansion card is complicated and performed at a high speed, and the circuit configuration of the motherboard or functional expansion card is complicated. Thus, the difference between the circuit configuration of the motherboard or functional expansion card and the circuit configuration of the IC tester is increased, and the problem described above became significant.

Therefore, in order to guarantee the quality of a semiconductor device, instead of the inspection performed by the IC tester, there is proposed a technique in which there is installed an inspection circuit that reproduces the circuit configuration where the semiconductor device is mounted on a probe card, e.g., the circuit configuration of a functional expansion card. In the technique, the electrical properties of the semiconductor device are measured without cutting the semiconductor device from a wafer in a state where the state of the semiconductor device mounted on the functional expansion card is imitated using the probe card. The inspection in the state where such a mounted state is imitated is referred to as a wafer system level test.

However, in order to accurately measure the electrical properties of the semiconductor device, it is necessary to perform a test (contact check) for determining whether a probe of the probe card and an electrode pad or the like of the semiconductor device are electrically in contact each other before the measurement. In the related art, a prober is connected to an IC tester, and the contact check is performed by applying a voltage to the electrode pad of the semiconductor device using an IFVM (I Force V Measure) function of a DC module provided in the IC tester. In addition, when an abnormal state is detected in the contact check, a cause of the abnormal state is determined based on a value of the voltage.

However, in a prober that performs the wafer system level test instead of the test performed by the IC tester, a high-priced IC tester is not used. Hence, the contact check cannot be performed by a DC module, and of course, a cause of an abnormal state regarding the contact between the probe and the electrode pad or the like cannot also be determined.

SUMMARY

Some embodiments of the present disclosure provide a substrate inspection apparatus in which a contact between a probe and a semiconductor device is checked without using any IC tester, and, when an abnormal state is detected in the contact check, a cause of the abnormal state can be determined.

According to one embodiment of the present disclosure, there is provided a substrate inspection apparatus including a probe card having a probe to be contacted with each electrode of a semiconductor device formed on a substrate, wherein the probe card includes an inspection circuit configured to reproduce a circuit configuration in which the semiconductor device cut from the substrate is to be mounted, and a potential measuring unit configured to measure a potential of a line between the probe and the inspection circuit.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
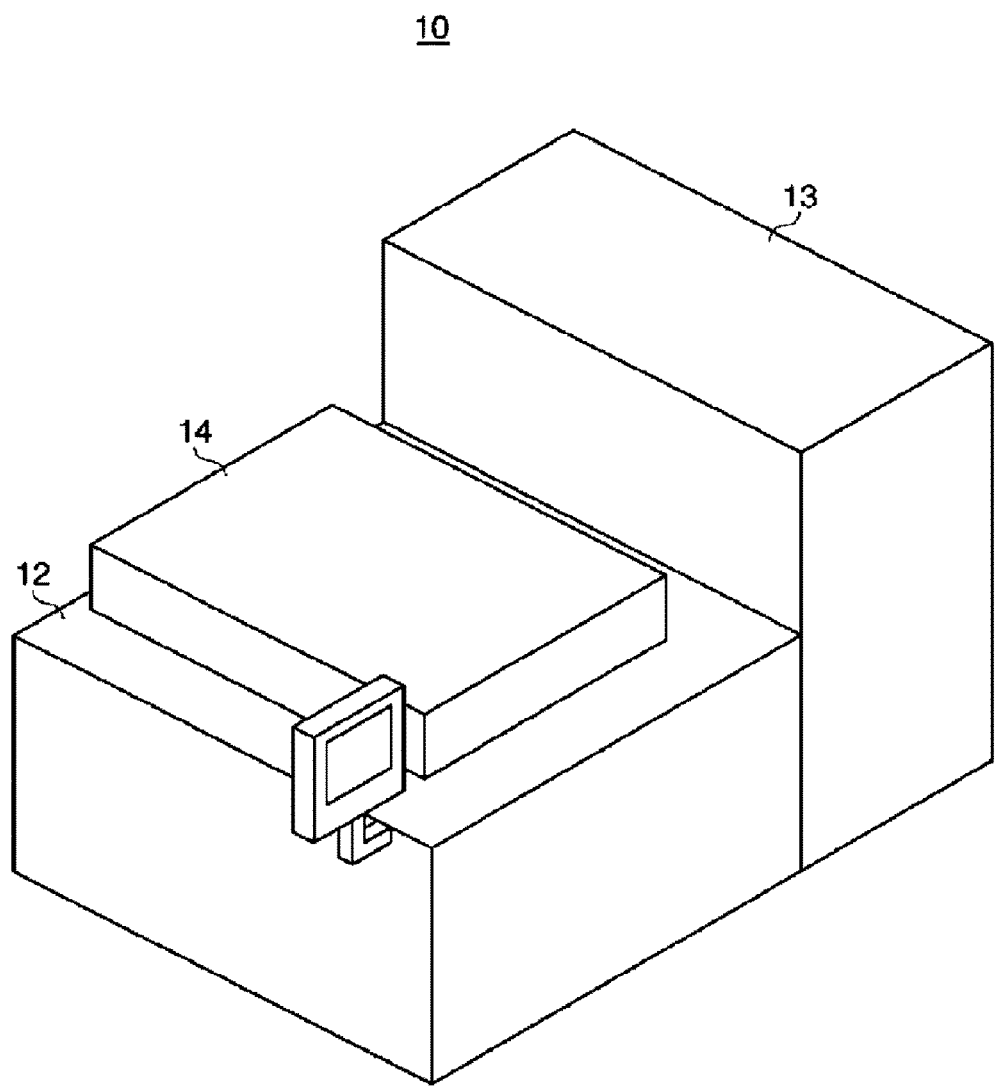
FIG. 1 is a perspective view schematically illustrating a configuration of a prober as a substrate inspection apparatus according to an embodiment of the present disclosure.
Figure 2:
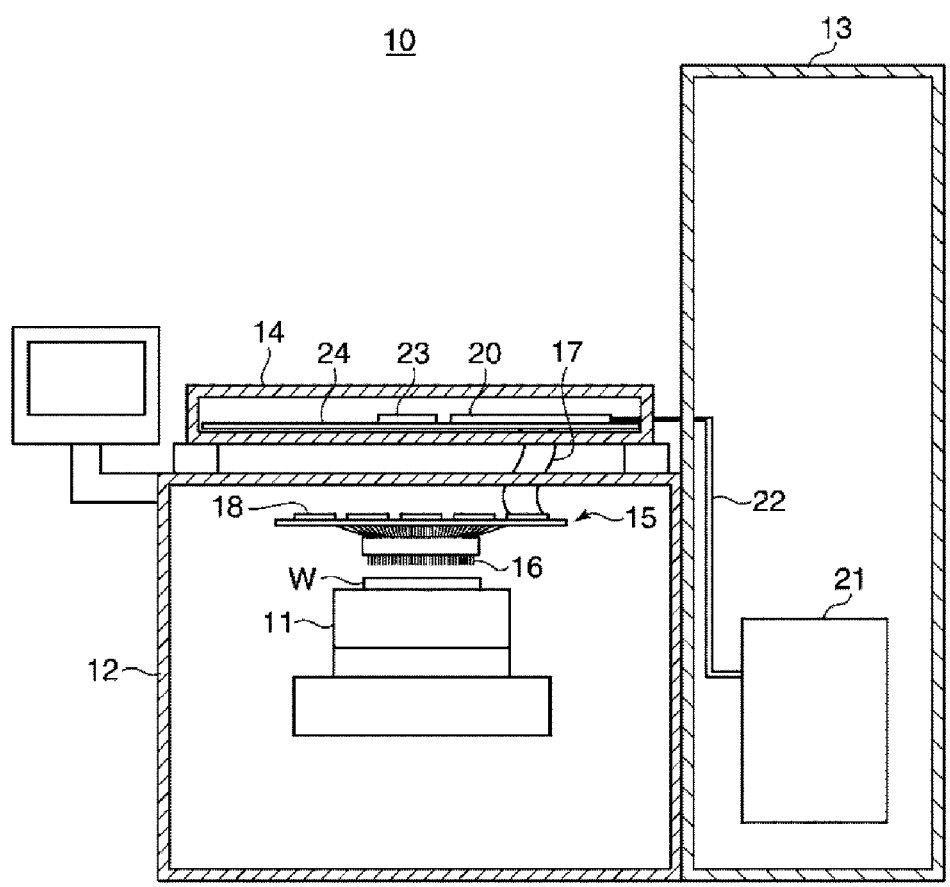
FIG. 2 is a front view schematically illustrating the configuration of the prober as the substrate inspection apparatus according to the embodiment.

FIG. 1 is a perspective view schematically illustrating the configuration of a prober as a substrate inspection apparatus according to an embodiment of the present disclosure, and FIG. 2 is a front view schematically illustrating the configuration of the prober. FIG. 2 is a partially sectional view illustrating components housed in a main body 12, a loader 13 and a test box 14, which will be described later.

In FIGS. 1 and 2, the prober 10 has the main body 12 in which a stage 11 for loading a wafer W thereon is housed, the loader 13 disposed adjacent to the main body 12, and the test box 14 disposed to cover the main body 12. The prober 10 inspects electrical properties of a semiconductor device formed on the wafer W.

The main body 12 has a hollow housing shape, in which, in addition to the stage 11 described above, a probe card 15 is disposed opposite to the stage 11. The probe card 15 is opposite to the wafer W. A plurality of probes 16 corresponding to electrode pads or solder bumps of the semiconductor device are disposed on a bottom surface of the probe card 15 facing the wafer W.

The wafer W is fixed to the stage 11 so that its position is not misaligned relative to the stage 11. The stage 11 can be moved in the horizontal and vertical directions, so that the electrode pads and the like of the semiconductor device is brought into contact with the respective probes 16 by controlling the relative position of the wafer W and the probe card 15. When covering the main body 12, the test box 14 is electrically connected to the probe card 15 through a flexible line 17.

The loader 13 takes out the wafer W having semiconductor devices formed thereon, which is accommodated in an FOUP (not shown) that is a transport container, and loads the wafer W on the stage 11 inside the main body 12. Also, the loader 13 removes the wafer W, on which the inspection of the electrical properties of the semiconductor devices has been finished, from the stage 11, and accommodates the removed wafer W in the FOUP.

The probe card 15 has card-side inspection circuits 18 for reproducing the circuit configuration in which a commercialized semiconductor device cut from the wafer W is mounted, e.g., the circuit configuration of DRAM. The card-side inspection circuit 18 is connected to each probe 16 through a line 19 to be described later. When the stage 11 approaches the probe card 15 and each probe 16 is brought into contact with the electrode pad or the like of the semiconductor device of the wafer W (hereinafter, simply referred to as the "electrode pad"), each probe 16 transmits an electrical signal from the contacted electrode pad to the card-side inspection circuit 18.

The test box 14 has an inspection control unit or recording unit (both not shown), a box-side inspection circuit 20 for reproducing the circuit configuration in which the DRAM is mounted, e.g., the circuit configuration of a motherboard, and a board 24 on which a hard disk formed with SSD (Solid State Drive) or the like is mounted. The line 17 transmits an electrical signal from the card-side inspection circuit 18 of the probe card 15 to the box-side inspection circuit 20. In the prober 10, the box-side inspection circuit 20 provided in the test box 14 is replaced, so that it is possible to reproduce some of the circuit configurations of plural kinds of motherboards.

The loader 13 has a base unit 21, which has a power source and a controller or a simple measurement module, housed therein. The base unit 21 is connected to the box-side inspection circuit 20 by a line 22, and the controller directs the box-side inspection circuit 20 to inspect the electrical properties of the semiconductor device.

As described above, in the prober 10, some of the circuit configurations of the plural kinds of motherboards are reproduced by the replacement of the box-side inspection circuit 20. However, the base unit 21 reproduces the circuit configuration common in various kinds of motherboards. That is, the box-side inspection circuit 20 and the base unit 21 cooperate with each other to reproduce the circuit configuration of the whole motherboards.

In the prober 10, when the electrical properties of the semiconductor device are inspected, it is determined based on an electrical signal from the card-side inspection circuit 18, for example, whether the inspection control unit of the box-side inspection circuit 20 transmits data to the card-side inspection circuit 18 and the transmitted data are accurately processed by the card-side inspection circuit 18 connected to the semiconductor device through each probe 16.

Further, in the prober 10, among the card-side inspection circuit 18, the box-side inspection circuit 20 and the base unit 21, the card-side inspection circuit 18 having the semiconductor device mounted thereon is disposed physically closest to the semiconductor device. Accordingly, in the inspection of the electrical properties, the influence of the length of a line between the semiconductor device and the card-side inspection circuit 18, e.g., the influence of a change in line capacitance, can be particularly suppressed. Thus, the inspection of the electrical properties of the semiconductor device can be performed under a line environment very close to the line environment in a computer as an actual mechanism having a DRAM or motherboard.

Figure 3:
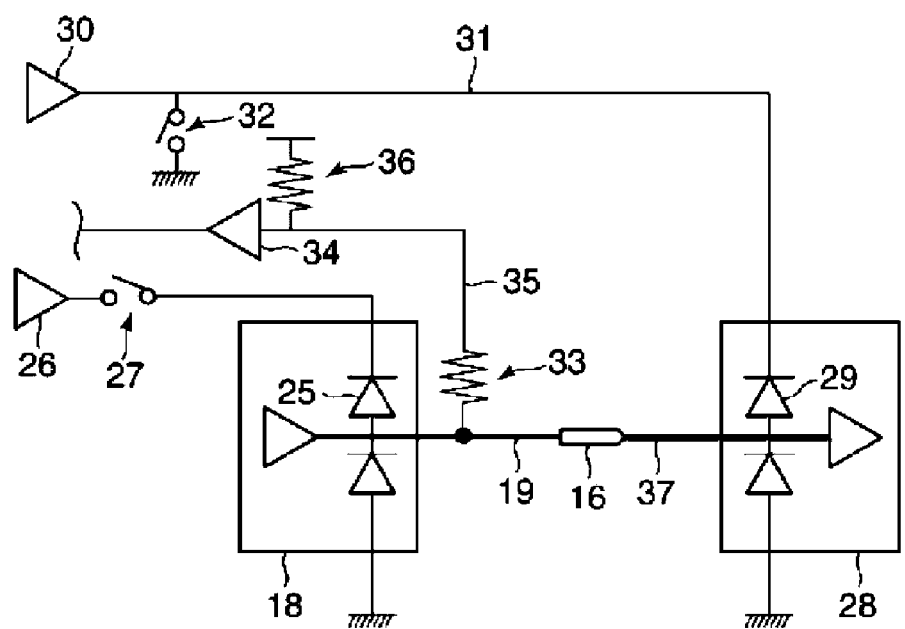
FIG. 3 is a circuit diagram illustrating a circuit configuration including a card-side inspection circuit in a probe card and a semiconductor device on a wafer.

FIG. 3 is a circuit diagram illustrating a circuit configuration including the card-side inspection circuit in the probe card and the semiconductor device on the wafer.

In FIG. 3, the card-side inspection circuit 18 is connected to an inspection circuit power source 26 through a protection diode 25 while being connected to the probe 16 through the line 19. In addition, a switch 27 is interposed between the inspection circuit power source 26 and the protection diode 25. The semiconductor device 28 of the wafer W is connected to a device power source 30 through a protection diode 29. Further, a line 31 between the protection diode 29 and the device power source 30 is connected to the ground through a switch 32.

The probe card 15 has a comparator 34 as a potential measuring unit connected to the line 19 through a high resistor 33 between the probe 16 and the card-side inspection circuit 18. A pull-up resistor 36 is installed to a line 35 between the line 19 and the comparator 34 in the vicinity of the comparator 34. The pull-up resistor 36 pulls up the potential measured by the comparator 34.

The high resistor 33 has a resistance value of, for example, 500Ω or more (2 kΩ in this embodiment), and restrains the current flowing in the line 19 from branching off and actively flowing in the comparator 34 through the line 35. The comparator 34 is a window comparator for determining which area of the potential of the line 35 belongs to among, for example, three potential areas, and is connected to a digital I/O card (not shown). In this embodiment, the probe card 15 uses the window comparator as the potential measuring unit. However, another device may be used as the potential measuring unit as long as the device is capable of measuring potential. For example, the potential measuring unit may include a DMM (Digital Multi Meter), an ordinary comparator, and an A/D converter.

In the prober 10, the card-side inspection circuit 18 or the line 19, which corresponds to each of a plurality of, e.g., a thousand probes 16, is installed. Further, a thousand comparators 34, which correspond to the respective lines 19, are installed.

Further, in the prober 10, when the stage 11 approaches the probe card 15 before the electrical properties of the semiconductor device 28 are measured, the contact check for determining whether each probe 16 is electrically in contact with an electrode pad 37 of the semiconductor device 28 is performed. When the contact check is performed, the switch 27 is closed so that a voltage, for example, of 1.3 V, is applied from the inspection circuit power source 26 to the card-side inspection circuit 18. As the device power source 30 is turned off, the switch 32 is closed so that the semiconductor device 28 is grounded through the line 31. At this time, the comparator 34 measures the potential of the line 19.

As described above, in order to restrain the current flowing in the line 19 from actively flowing in the comparator 34, only a current of, for example, 0.5 µA flows in the high resistor 33, so that the potential difference between the line 19 and the comparator 34 becomes 0.1 V. Further, in the prober 10, the potential difference of the protection diode 25 and the protection diode 29 is set to 0.7 V.

In a normal state in which the probe 16 and the electrode pad 37 are electrically in contact with each other (hereinafter, referred to as a "normal contact state"), only the potential difference of the protection diode 29, which is set, for example, to 0.7 V as described above, is reflected in the potential of the line 19. Hence, the potential of the line 19 is 0.7 V. Further, the potential of the line 35 becomes 0.8 V obtained by adding the potential difference between the line 19 and the comparator 34 to the potential of the line 19.

In an abnormal state in which the probe 16 and the electrode pad 37 are not electrically in contact with each other (hereinafter, referred to as a "non-contact state"), the potential of a voltage applied by the inspection circuit power source 26 and the potential difference of the protection diode 25 are reflected in the potential of the line 19. Hence, the potential of the line 19 is 2.0 V, and the potential of the line 35 becomes 2.1 V.

Further, in an abnormal state in which although the probe 16 and the electrode pad 37 are electrically in contact with each other, the semiconductor device 28 is directly grounded (short-circuited) without passing through the line 31 (hereinafter, referred to as a "short-circuit state"), the potential of the semiconductor device 28, i.e., the ground potential, is reflected in the potential of the line 19. Hence, the potential of the line 19 is 0 V, and the potential of the line 35 becomes 0.1 V.

That is, the potential of the line 19 and further the potential of the line 35 are changed depending on whether the probe 16 and the electrode pad 37 are electrically in contact with each other, and are also changed depending on the cause of an abnormal state regarding the contact between the probe 16 and the electrode pad 37. In this embodiment, the comparator 34 determines which one the potential of the line 35 belongs to among the above-described three potential areas (0.8 V, 2.1 V and 0.1 V). For example, if the potential of the line 35 is near 0.8 V, it can be determined that the probe 16 and the electrode pad 37 are electrically in contact normally with each other. If the potential of the line 35 is near 2.1 V, it can be determined that the probe 16 and the electrode pad 37 are not electrically in contact with each other. If the potential of the line 35 is near 0.1 V, it can be determined that the semiconductor device 28 is directly grounded. Thus, in the prober 10 according to this embodiment, the contact between the probe 16 and the electrode pad 37 is checked without using any IC tester. Therefore, when an abnormal state is detected during the contact check, a cause of the abnormal state can be determined.

In the above-described prober 10, the high resistor 33 restrains the current flowing in the line 19 from actively flowing in the comparator 34. Thus, when the electrical properties of the semiconductor device 28 are measured after the contact check for determining whether the probe 16 and the electrode pad 37 are electrically in contact with each other is performed, the current flowing in the line 19 can be stabilized. Accordingly, the electrical properties of the semiconductor device 28 can be stably measured.

While the present disclosure has been described with the embodiment, the present disclosure is not limited to the above-described embodiment.

For example, in the embodiment, the resistance value of the high resistor 33 is 2 kΩ, the voltage applied by the inspection circuit power source 26 is 1.3 V, the potential difference of the protection diode 25 and the protection diode 29 is 0.7 V, and the current flowing in the high resistor 33 is 0.5 µA. However, the resistance value, the voltage, the potential difference and the current are for illustrative purposes, and other values may be set according to specifications of the card-side inspection circuit 18 or the semiconductor device 28. In this state, the potential of the line 35 in the normal contact state becomes a value different from 0.8 V, the potential of the line 35 in the non-contact state becomes a value different from 2.1 V, and the potential of the line 35 in the short-circuit state becomes a value different from 0.1 V. However, the potentials of the line 35 in the normal contact state, the non-contact state and the short-circuit state become values different from one another. Hence, the comparator 34 determines which one the potential of the line 35 belongs to among the three potential areas (near the potential in the normal contact state, near the potential in the non-contact state, and near the potential in the short-circuit state). By doing so, the contact between the probe 16 and the electrode pad 37 is checked. In addition, when an abnormal state is detected during the contact check, a cause of the abnormal state can be determined.

In the above embodiment, as described above, the DMM may be used as the potential measuring unit. Accordingly, the potential of the electrode pad 37, which is variously changed due to the diode housed in the semiconductor device 28 that is DUT (Device Under Test) or other termination circuits, can be measured without replacing any circuit for measuring potential.

Figure 4:
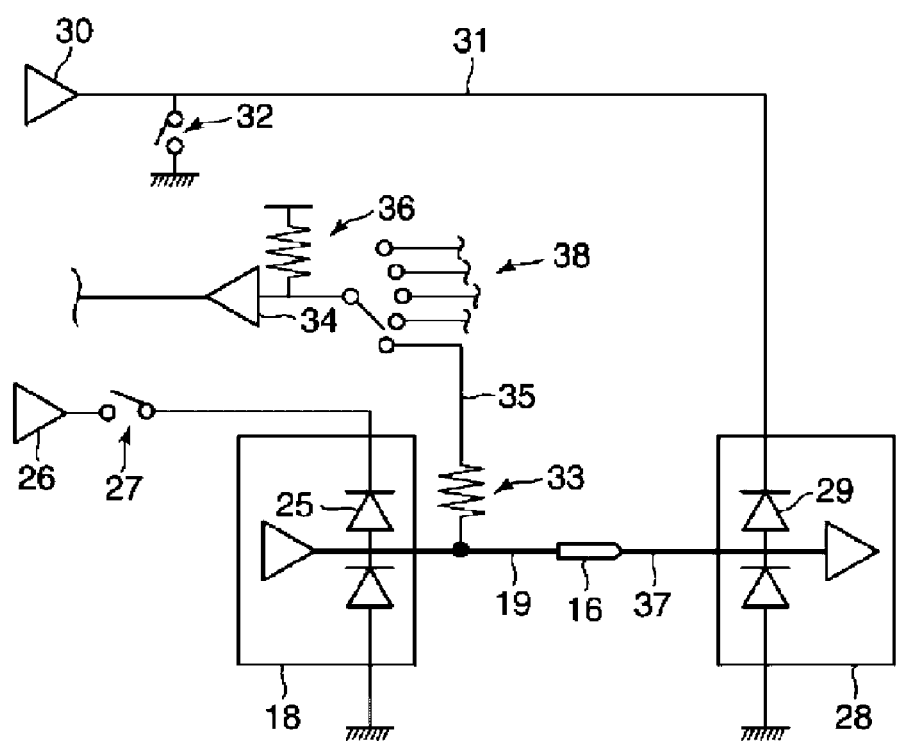
FIG. 4 is a circuit diagram illustrating a modification of the configuration of the card-side inspection circuit in the probe card and the semiconductor device on the wafer.

Further, in the embodiment, the 1000 comparators 34 have been installed corresponding to the respective lines 19 corresponding to the 1000 probes 16, but only one comparator 34 may be installed in the probe card 15. In this case, as shown in FIG. 4, there is disposed a relay matrix 38 (connection switching unit) for switching a connection point of the comparator 34 into any one of a plurality of lines 35 branching from each line 19 connected to each card-side inspection circuit 18 and each probe 16. Accordingly, it is unnecessary to dispose a plurality of comparators 34 in the probe card 15, and thus it is possible to simplify the configuration of the probe card 15.

In the embodiment, it has been described that the box-side inspection circuit 20 or the base unit 21 reproduces the circuit configuration of the motherboard and the card-side inspection circuit 18 reproduces the circuit configuration of the DRAM. However, the circuit configuration reproduced by the box-side inspection circuit 20 or the base unit 21 is not limited to the circuit configuration of the motherboard and the circuit configuration reproduced by the card-side inspection circuit 18 is not limited to the circuit configuration of the DRAM. That is, the circuit configuration reproduced by the card-side inspection circuit 18, the box-side inspection circuit 20 or the base unit 21 may be the circuit configuration in which the semiconductor device 28 that is the DUT is mounted. The semiconductor device 28 is not also limited to a specific configuration. For example, when the circuit configuration reproduced by the card-side inspection circuit 18 is the circuit configuration of an expansion card, the semiconductor device 28 may be an MPU (Main Processing Unit). When the circuit configuration reproduced by the box-side inspection circuit 20 or the base unit 21 is the circuit configuration of the motherboard as described above, the semiconductor device may be an APU (Accelerated Processing Unit) or GPU (Graphics Processing Unit). When the circuit configuration reproduced by the card-side inspection circuit 18, the box-side inspection circuit 20 and the base unit 21 is the circuit configuration of a television, the semiconductor device may be an RF tuner.

According to the present disclosure in some embodiments, the potential of the line between the probe and the inspection circuit is measured in the probe card. The potential of the line between the probe and the inspection circuit is changed depending on a contact state of the probe and the electrode pad or the like of the semiconductor device. In addition, the potential is also changed depending on a cause of an abnormal state regarding the contact between the probe and the electrode pad or the like. Thus, the potential of the line between the probe and the inspection circuit is measured, so that the contact between the probe and the semiconductor is checked without using any IC tester. Accordingly, when an abnormal state is detected in the contact check, a cause of the abnormal state can be determined.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate inspection apparatus comprising a probe card having a probe to be contacted with each electrode of a semiconductor device formed on a substrate,
   wherein the probe card includes an inspection circuit configured to reproduce a circuit configuration in which the semiconductor device cut from the substrate is to be mounted, and a potential measuring unit configured to measure a potential of a line between the probe and the inspection circuit,
   the potential measuring unit determining, based on the measured potential, a contact state between the probe and the electrode selected from a group consisting of a normal contact state where the probe and the electrode are electrically in contact with each other, a non-contact state where the probe and the electrode are not electrically in contact with each other, and a short-circuit state where the probe and the electrode are electrically in contact with each other but the semiconductor device is short-circuited, wherein the inspection circuit is connected to an inspection circuit power source through a first protection diode and a first switch is interposed between the inspection circuit power source and the first protection diode,
   wherein the inspection circuit is connected to an inspection circuit power source through a first protection diode and a first switch is interposed between the inspection circuit power source and the first protection diode,
   wherein the semiconductor device is connected to a device power source through a second protection diode and a line between the second protection diode and the device power source is connected to the ground through a second switch, and
   wherein the potential measuring unit measures the potential of the line between the probe and the inspection circuit in a state where the first and second switches are closed so that a predetermined voltage is applied to the inspection circuit and the semiconductor device is grounded through the line between the second protection diode and the device power source.

2. The apparatus of claim 1, wherein a resistor is disposed between the potential measuring unit and the line between the probe and the inspection circuit.

3. The apparatus of claim 2, wherein the resistor has a resistance of 500Ω or more.

4. The apparatus of claim 1, wherein the probe card includes the plurality of lines configured to connect the inspection circuit with a plurality of the probes, and a connection switching unit configured to switch a connection point of the potential measuring unit into one of the plurality of lines.

5. The apparatus of claim 1, wherein the potential measuring unit is a comparator, a DMM (Digital Multi Meter) or an A/D converter.

6. The apparatus of claim 1, wherein the potential measuring unit determines the contact state between the probe and the electrode is the normal contact state when the measured potential equals to a potential difference of the second protection diode.

7. The apparatus of claim 1, wherein the potential measuring unit determines the contact state between the probe and the electrode is the non-contact state when the measured potential equals to a sum of the predetermined voltage and a potential difference of the first protection diode.

8. The apparatus of claim 1, wherein the potential measuring unit determines the contact state between the probe and the electrode is the short-circuit state when the measured potential equals to zero.

* * * * *